(12) United States Patent
Bode et al.

(10) Patent No.: US 6,528,331 B1
(45) Date of Patent: *Mar. 4, 2003

(54) METHOD FOR IDENTIFYING AND CONTROLLING IMPACT OF AMBIENT CONDITIONS ON PHOTOLITHOGRAPHY PROCESSES

(75) Inventors: Christopher A. Bode, Austin, TX (US); Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/094,061

(22) Filed: Mar. 8, 2002

Related U.S. Application Data

(62) Division of application No. 09/371,561, filed on Aug. 10, 1999, now Pat. No. 6,368,883.

(51) Int. Cl.[7] .............................................. H01L 21/66
(52) U.S. Cl. ........................................................ 438/14
(58) Field of Search ............................ 438/14; 427/576; 219/530; 430/315

(56) References Cited

U.S. PATENT DOCUMENTS 5,986,906 A * 11/1999 Zhao .......................... 134/1.1
6,090,530 A * 7/2000 Wildman ................... 430/315
6,368,883 B1 * 4/2002 Bode ........................... 438/14

* cited by examiner

Primary Examiner—John F. Niebling
Assistant Examiner—André C. Stevenson
(74) Attorney, Agent, or Firm—Williams, Morgan & Amerson, P.C.

(57) ABSTRACT

The invention is, in its various aspects, a method and apparatus for processing a semiconductor wafer. More particularly, the invention is a method and apparatus for identifying and controlling the impact of ambient conditions on photolithography processes. In a first aspect, the invention is a method for processing a semiconductor wafer. The method comprises identifying a disturbance in a photolithographic process arising from an ambient condition; modeling the identified disturbance; and applying the model to modify a control input parameter. In a second aspect, the invention is an apparatus for controlling a photolithography process. The apparatus includes an exposure tool, including a photolithography controller; and a computer receiving data from the exposure tool. The computer is programmed to perform a method comprising: identifying a disturbance in a photolithographic process arising from an ambient condition; modeling the identified disturbance; and applying the model to modify a control input parameter.

10 Claims, 3 Drawing Sheets

METHOD FOR IDENTIFYING AND CONTROLLING IMPACT OF AMBIENT CONDITIONS ON PHOTOLITHOGRAPHY PROCESSES

This is a divisional of application Ser. No. 09/371,561 filed Aug. 10, 1999, now U.S. Pat. No. 6,368,883.

BACKGROUND OF THE INVENTION

1. Field of the Invention

This invention pertains to a method and apparatus for processing a semiconductor wafer and, more particularly, to a method and apparatus for identifying and controlling the impact of ambient conditions on photolithography processes.

2. Description of the Related Art

Semiconductor devices, or microchips, are manufactured from wafers of a substrate material. Layers of materials are added, removed, and/or treated during fabrication to create the electrical circuits that make up the device. The fabrication essentially comprises four basic operations. The four operations are:

layering, or adding thin layers of various materials to a wafer from which a semiconductor is produced;

patterning, or removing selected portions of added layers;

doping, or placing specific amounts of dopants in the wafer surface through openings in the added layers; and heat treatment, or heating and cooling the materials to produce desired effects in the processed wafer.

Although there are only four basic operations, they can be combined in hundreds of different ways, depending upon the particular fabrication process. Indeed, whole texts have been written on the many ways in which these operations can be employed. See, e.g., Peter Van Zant, Microchip Fabrication A Practical Guide to Semiconductor Processing (3d Ed. 1997 McGraw-Hill Companies, Inc.) (ISBN 0-07-067250-4).

Patterning is also sometimes called photolithography, photomasking, masking, oxide removal, metal removal, and microlithography. The term "photolithography" will hereafter be used to refer to patterning operations. In photolithography, typically, a machine called a "stepper" positions a portion of a wafer being processed under a "reticle," or photomask. A reticle is a copy of a pattern created in a layer of chrome on a glass plate. Light is then shone onto the wafer through the reticle. The chrome blocks some of the light. The light shining through the pattern on the reticle changes the material characteristics of the wafer where it contacts the wafer. These changes make the material more or less susceptible to removal in another operation, depending on the particular process being implemented. The stepper then positions another portion of the wafer under the reticle, and the operation is repeated. This process is repeated until the entire wafer has undergone the operation.

The purpose of photolithography is to create in or on a wafer the parts of what will ultimately be the semiconductor device. The parts must be laid down in the exact dimensions, within certain manufacturing tolerances, required by the circuit design and to locate them in their proper place. Some people consequently consider photolithography to be the most critical of these four basic operations.

The photolithography operations generally set the "critical dimensions" of the semiconductor devices. Errors can cause a whole host of problems including, but not limited to, distorted patterns, misplaced patterns, and other defects. These types of errors can undesirably change the functioning of the electrical circuits so that the wafer has to be scrapped. Photolithography processes are performed at very small dimensions, so that they are also highly susceptible to contamination by particulates or unwanted variations in processing conditions.

One type of processing condition is called an "ambient" condition. Ambient conditions in the processing facility, such as air pressure, temperature, and humidity, significantly impact the performance of semiconductor photolithography tool. Variations in the ambient conditions may deleteriously affect the operation of the tool because photolithography techniques need to account for the effect such conditions have on the operation, especially when they vary. However, there is no known mechanism for controlling photolithographic processes to account for this impact.

The present invention is directed to resolving one or all of the problems mentioned above.

SUMMARY OF THE INVENTION

The invention is, in its various aspects, a method and apparatus for processing a semiconductor wafer. More particularly, the invention is a method and apparatus for identifying and controlling the impact of ambient conditions on photolithography processes. In a first aspect, the invention is a method for processing a semiconductor wafer. The method comprises identifying a disturbance in a photolithographic process arising from an ambient condition; modeling the identified disturbance; and applying the model to modify a control input parameter. In a second aspect, the invention is an apparatus for controlling a photolithography process. The apparatus includes an exposure tool, including a photolithography controller; and a computer receiving data from the exposure tool. The computer is programmed to perform a method comprising: identifying a disturbance in a photolithographic process arising from an ambient condition; modeling the identified disturbance; and applying the model to modify a control input parameter.

BRIEF DESCRIPTION OF THE DRAWINGS

The invention may be understood by reference to the following description taken in conjunction with the accompanying drawings, in which like reference numerals identify like elements, and in which.

Figure 1:
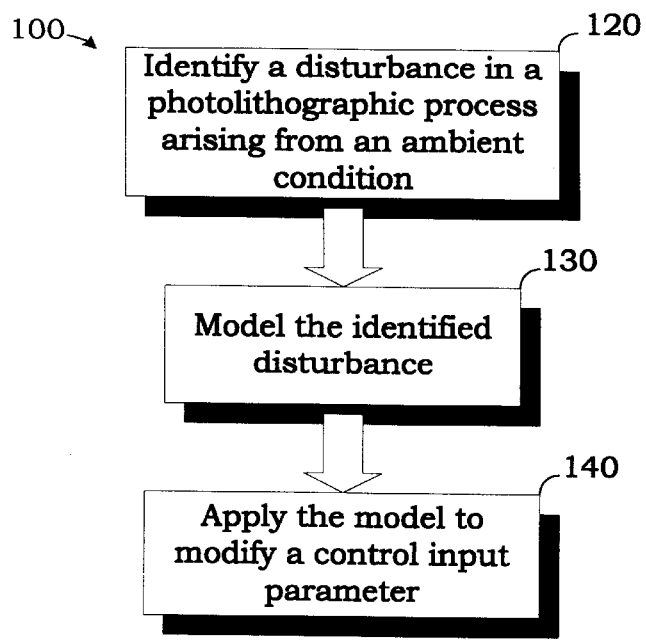
FIG. 1 illustrates a method for fabricating a semiconductor device practiced in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Ambient conditions have a significant impact on the performance of semiconductor lithography tools. Identification and correlation of variations in ambient conditions to affects on photolithography performance allows for compensation of their effects. The resultant measurements can then be formulated into a model that relates ambient conditions to disturbances in the performance of photolithography tools. Once this relationship is identified, the photolithography tool variables can be manipulated to compensate for changes in ambient conditions. This procedure can effectively reduce or eliminate the impact of uncontrolled ambient disturbances that can significantly increase the repeatability and capability of photolithography tools in semiconductor manufacturing.

Figure 2:
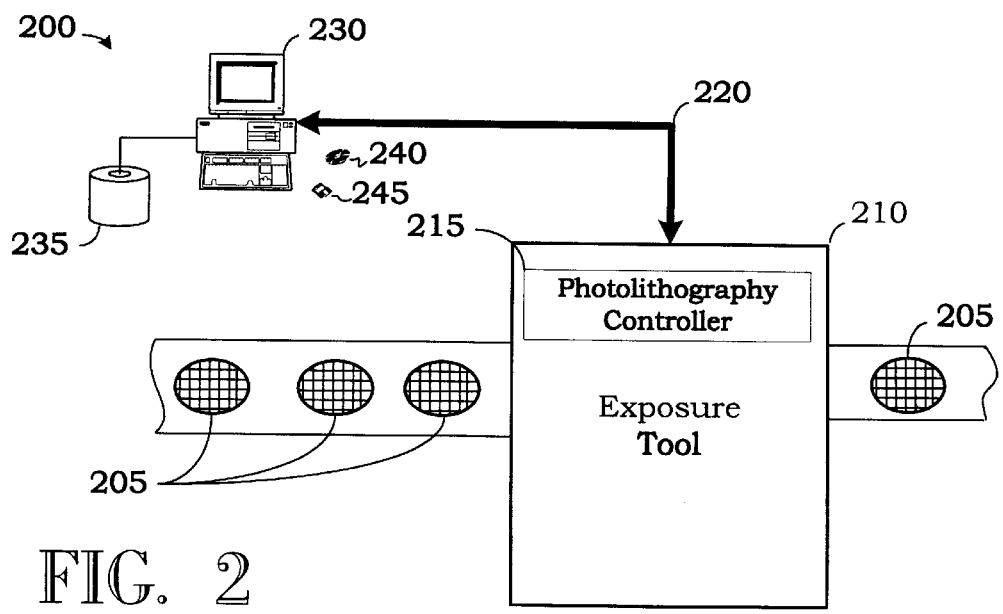
FIG. 2 illustrates semiconductor wafers being processed on an exposure tool, using a plurality of control input signals, in accordance with the present invention.

FIG. 1 illustrates one particular embodiment of a method 100 practiced in accordance with the present invention. FIG. 2 illustrates one particular apparatus 200 with which the method 100 may be practiced. For the sake of clarity, and to further an understanding of the invention, the method 100 shall be disclosed in the context of the apparatus 200. However, the invention is not so limited and admits wide variation as is discussed further below.

Referring now to both FIGS. 1 and 2, a lot of wafers 205 is being processed through an exposure tool 210. The exposure tool 210 may be any exposure tool known to the art, provided it includes the requisite control capabilities. The exposure tool 210 includes a photolithography controller 215 for this purpose. The nature and function of the photolithography controller 215 will be implementation specific. For instance, it may be either a critical dimension controller or an overlay controller since the tool 200 is an exposure tool. Four wafers 205 are shown in FIG. 2, but the lot of wafers, i.e., the "wafer lot," may be any practicable number of wafers from one to several thousand.

The method 100 begins, as set forth in the box 120, by identifying a disturbance in a photolithographic process arising from an ambient condition. A "disturbance," as that term is used herein, is an adverse effect in the overlay control that is not caused by the control inputs to the overlay control. The nature, identity, and identification of disturbances will be largely implementation specific and even tool specific. For instance, capabilities for monitoring process parameters vary, to some degree, from tool to tool. Greater sensing capabilities may permit wider latitude in what disturbances are identified and the manner in which this is done. Conversely, lesser sensing capabilities may restrict this latitude.

Exemplary ambient conditions include, but are not limited to, pressure, temperature, and relative humidity. Parameters for a process are generally determined on the assumptions that the process will occur under certain baseline ambient conditions. In reality, however, ambient conditions vary from the baseline conditions. It is these deviations from the baseline that constitute disturbances affecting the process. One such disturbance attributable to deviant ambient conditions is magnification, which may adversely impacted by temperatures deviating from the baseline. This may translate into a change in the magnification overlay parameter. In order to avoid such an interaction, the effect upon magnification can be anticipated and compensated by adjusting the overlay inputs at the same time in accordance with the present invention. Other disturbances might also be encountered in lieu of or in addition to magnification depending on the particular implementation.

Returning to FIG. 2, in this particular embodiment, the process parameters are monitored by tool sensors (not shown). The outputs of these tool sensors are transmitted to the computer system 230 over the line 220. The computer system 230 analyzes these sensor outputs to identify the disturbances.

Turning, to FIG. 1, once the disturbance is identified, the method 100 proceeds by modeling the identified disturbance, as set forth in the box 130. The computer system 230 in FIG. 2 is, in this particular embodiment, programmed to model the disturbance. The manner in which this modeling occurs will be implementation specific.

In the embodiment of FIG. 2, the database 235 stores a plurality of models that might potentially be applied depending upon which disturbance is identified. This particular embodiment, therefore, requires some a priori knowledge of what disturbances might be encountered. The computer system 230 then extracts an appropriate model from the database of potential models to apply to the identified disturbances. If the database 235 does not include an appropriate model, then the disturbance may be ignored or the computer system 230 may attempt to develop one if so programmed. The database 235 may be stored on any kind of computer-readable, program storage medium, such as the optical disk 240, the floppy disk 245, or the hard disk drive (not shown) of the computer system 230. The database 235 may also be stored on a separate computer system (not shown) that interfaces with the computer system 230.

However, the modeling of the identified disturbance may be implemented differently in alternative embodiments. For instance, the computer system 230 may be programmed using some form of artificial intelligence to analyze the sensor outputs and controller inputs to develop a model on the fly in real time. This approach might be a useful adjunct to the embodiment illustrated in FIG. 2 and discussed above where disturbances are identified for which the database 235 has no appropriate model.

The method 100 of FIG. 1 then proceeds by applying the model to modify a control input parameter, as set forth in the box 140. Depending on the implementation, applying the model may yield either a new value for the control input parameter or a correction to the existing control input parameter. The new control input is then formulated from the value yielded by the model and is transmitted to the overlay controller 250 over the line 220. The overlay controller 250 then controls subsequent photolithography process operations in accordance with the new control inputs.

Some alternative embodiments may employ a form of feedback to improve the modeling of disturbances. The implementation of this feedback is dependent on several disparate facts, including the tool's sensing capabilities and economics. One technique for doing this would be to monitor the affect a model's implementation and updating the model. The update will depend on the model and it's affect.

For instance a linear model will require a different update than will a non-linear model if all else is equal.

As is evident from the discussion above, some features of the present invention are implemented in software. For instance, the acts set forth in the boxes 120–140 in FIG. 1 are, in the illustrated embodiment, software implemented in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 245 or the computer 230's hard disk drive, or optical, such as the optical disk 240. When these instructions are executed by a computer, they perform the disclosed functions. The computer may be a desktop computer, such as the computer 230. However, the computer might alternatively be a processor embedded in the exposure tool 210. The computer might also be a laptop, a workstation, or a mainframe in other embodiments. The scope of the invention is not limited by the type or nature of the program storage medium or computer with which it might be implemented.

Thus, some portions of the detailed descriptions herein are, or may be, presented in terms of algorithms, functions, techniques, or processes. These terms are the means used by those skilled in the art most effectively convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated.

It has proven convenient at times, principally for reasons of common usage, to refer to these signals as bits, values, elements, symbols, characters, terms, numbers, or the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," or the like, used herein refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

One Particular Implementation

Figure 3:
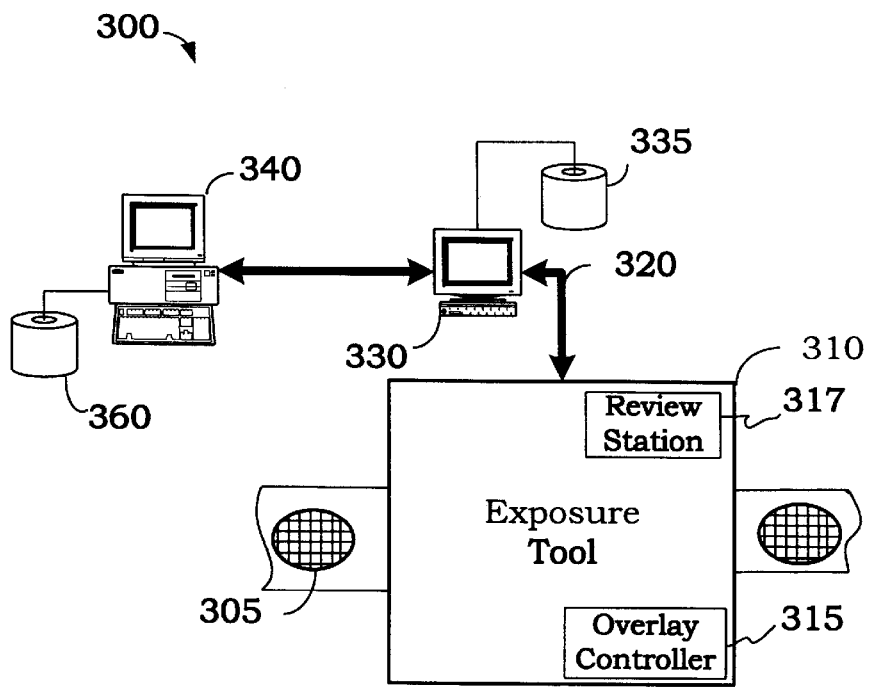
FIGS. 3–4 illustrate one particular embodiment of the process and tool in FIG. 2.
Figure 4:
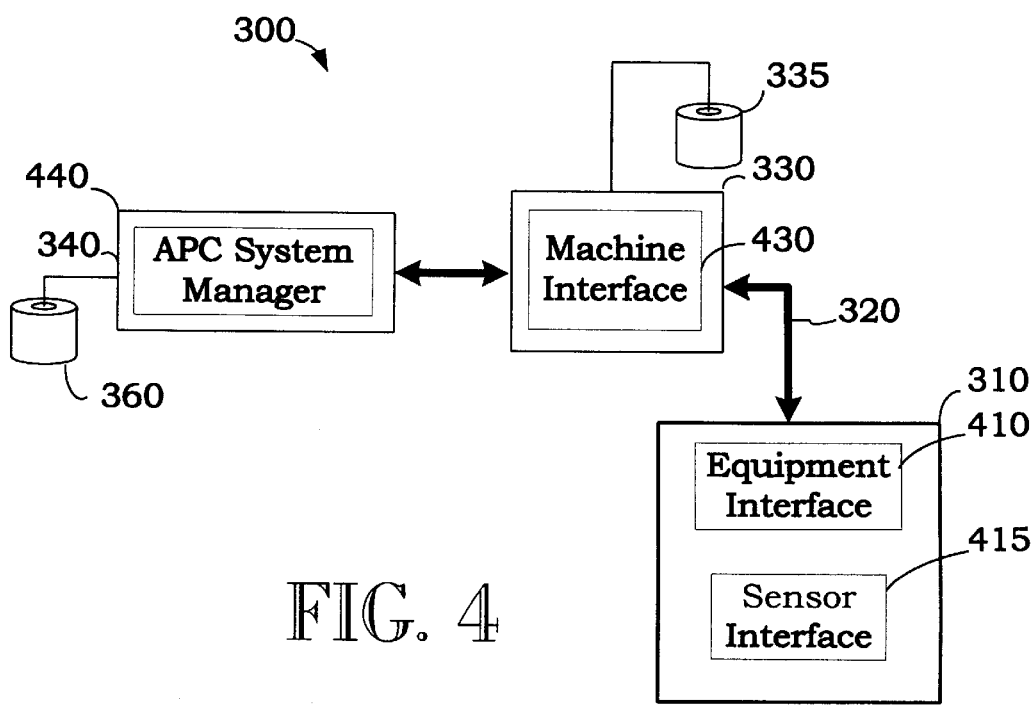
Figure 5:
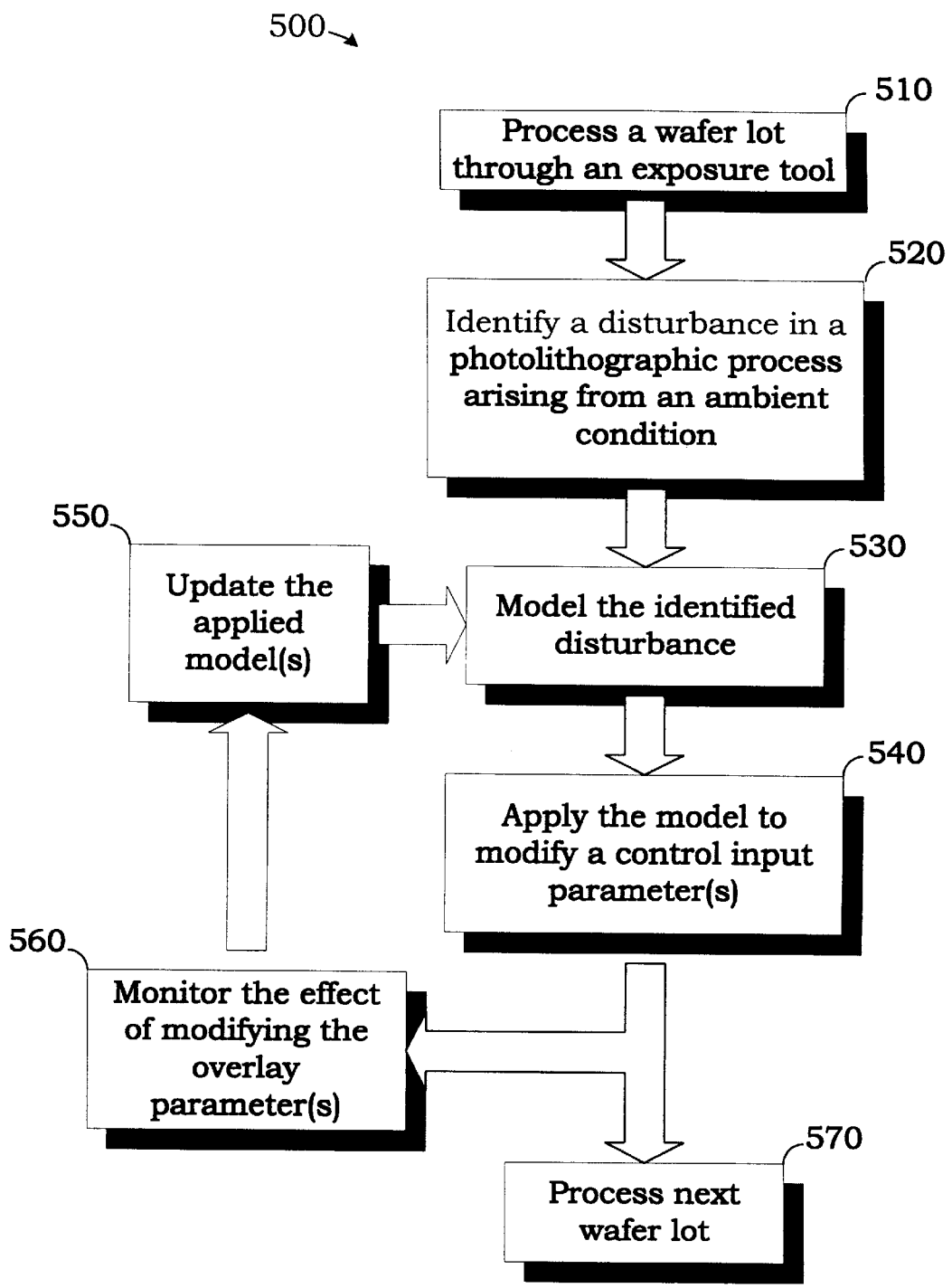
FIG. 5 illustrates one particular embodiment of the method of FIG. 1 as may be practiced with the process and tool of FIGS. 3–4.

One particular implementation of the present invention is illustrated in FIGS. 3–5. This particular implementation is a modification of the overlay controller disclosed and claimed in the application Ser. No. 09/371,550, entitled "Method and Apparatus for Run-to-Run Controlling of Overlay Registration," filed Aug. 10, 1999, in the name of Anthony J. Toprac, Christopher A. Bode, and Richard D. Edwards. This application is hereby incorporated by reference for all purposes as is set forth fully verbatim herein. The modification effects the method of FIGS. 1–2 in the controller of that application. However, the invention is not so limited and may be practiced with other controllers.

Construction of the Apparatus. An exemplary embodiment 300 of the apparatus 200 in FIG. 2 is illustrated in FIGS. 3–4, in which the apparatus 300 comprises a portion of an Advanced Process Control ("APC") system. FIGS. 3–4 are conceptualized, structural and functional block diagrams, respectively, of the apparatus 300. A set of processing steps is performed on a lot of wafers 305 on an exposure tool 300, sometimes called a "stepper." Because the apparatus 300 is part of an APC system, the wafers 305 are processed on a run-to-run basis. Thus, process adjustments are made and held constant for the duration of a run, based on run-level measurements or averages. A "run" may be a lot, a batch of lots, or even an individual wafer.

In this particular embodiment, the wafers 305 are processed on an exposure tool 310 and various operations in the process are controlled by a plurality of control input signals on a line 320 between the tool 310 and the workstation 330. Exemplary control inputs for this embodiment might include an x-translation signal, a y-translation signal, an x-expansion wafer scale signal, a y-expansion wafer scale signal, a reticle magnification signal, and a reticle rotation signal.

When a process step in the exposure tool 310 is concluded, the semiconductor wafer being processed in the exposure tool 310 is examined in a review station 317. The control inputs generally affect the accuracy of the process steps performed by the exposure tool 310 on the wafers 305. Once errors are determined from the examination after the run of a lot of wafers 305, the control inputs on the line 320 are modified for a subsequent run of a lot of wafers 305. Modifying the control signals on the line 320 is designed to improve the next process step in the exposure tool 310.

Once errors are determined from the examination after the run of a lot of wafers, the control inputs on the line 320 are modified for a subsequent run of a lot of semiconductor wafers. Modifying the control signals on the line 320 is designed to improve the next process step in the exposure tool 310. The modification is performed in accordance with one particular embodiment of the method 100 set forth in FIG. 1, as described more fully below. Once the relevant control input signals for the exposure tool 300 are updated, the control input signals with new settings are used for a subsequent run of semiconductor devices.

Referring now to both FIGS. 3 and 4, the exposure tool 300 communicates with a manufacturing framework comprising a network of processing modules. One such module is the APC system manager 440 resident on the computer 340. This network of processing modules constitutes the APC system. The exposure tool 300 generally includes an equipment interface 410 and a sensor interface 415 and a machine interface 430 resides on the workstation 330. The machine interface 430 bridges the gap between the APC framework, e.g., the APC system manage 440, and the equipment interface 410. Thus, the machine interface 430 interfaces the exposure tool with the APC framework and supports machine setup, activation, monitoring, and data collection. The sensor interface 415 provides the appropriate interface environment to communicate with external sensors such as LabView® or other sensor bus-based data acquisition software. Both the machine interface 430 and the sensor interface 415 use a set of functionality to collect data to be used. The equipment interface 410 and the sensor interface 415 communicate over a line 320 with a machine interface 430 resident on a workstation 230.

More particularly, the machine interface 430 receives commands, status events, and collected data from the equipment interface 410 and forwards as needed to other APC components and event channels. In turn, responses from APC components are received by the machine interface 430 and rerouted to the equipment interface 410. The machine interface 430 also reformats and restructures messages and data as necessary. The machine interface 430 supports the startup/shutdown procedures within the APC System Manager 440. It also serves as an APC data collector, buffering data collected by the equipment interface 410, and emitting appropriate data collection events.

In the particular embodiment illustrated, the APC system is a factory-wide software system, but this is not necessary to the practice of the invention. The control strategies taught by the present invention can be applied to virtually any semiconductor exposure tool on a factory floor. Indeed, the present invention may be simultaneously employed on multiple exposure tools in the same factory or in the same fabrication process. The APC framework permits for remote access and monitoring of the process performance. Furthermore, by utilizing the APC framework, data storage can be more convenient, more flexible, and less expensive than local drives. However, the invention may be employed, in some alternative embodiments, on local drives.

The illustrated embodiment deploys the present invention onto the APC framework utilizing a number of software components. In addition to components within the APC framework, a computer script is written for each of the semiconductor exposure tools involved in the control system. When a semiconductor exposure tool in the control system is started in the semiconductor manufacturing fab, it generally calls upon a script to initiate the action that is required by the overlay controller. The control methods are generally defined and performed in these scripts. The development of these scripts can comprise a significant portion of the development of a control system.

In this particular embodiment, there are several separate software scripts that perform the tasks involved in controlling the photolithography operation. There is one script for the exposure tool 310. including the review station 317 the overlay controller 315. There is also a script to handle the actual data capture from the review station 317 and another script that containing common procedures that can be referenced by any of the other scripts. There is also a script for the APC system manager 440. The precise number of scripts, however, is implementation specific and alternative embodiments may use other numbers of scripts.

Operating the Apparatus. FIG. 5 illustrates one particular embodiment 500 of the method 100 in FIG. 1. The method 500 may be practiced with the apparatus 300 illustrated in FIGS. 3–4, but the invention is not so limited. The method 500 may be practiced with any apparatus that may perform the functions set forth in FIG. 5. Furthermore, the method 100 in FIG. 1 may be practiced in embodiments alternative to the method 500 in FIG. 5.

Overlay operations do not necessarily occur at all phases of the process and, thus, overlay control is not implicated in all operations. For purposes of illustration, assume the overlay control procedure begins at the source/drain portion of the fabrication process in one particular embodiment. The exposure tool 300 exposes the photoresist (not shown), which in turn defines the active areas of the wafer. The overlay controller 315 will treat this as the previous layer when it processes wafer lots through the poly gate steps, so some information is required from wafer lots run at this step. The subsequent time that semiconductor wafer lots enter the domain of the overlay controller 315 is generally during the poly gate portion of semiconductor device fabrication. This is the patterned level just above the source/drain layer. These two adjacent patterned layers are subject to overlay metrology, which enable the use of feedback control to correct errors in overlay. This is generally true for any two adjacent patterned layers that are followed by a review station metrology step.

Referring now to all of FIGS. 3–5, the method 500 begins with processing a lot of wafers 305 through an exposure tool 310, as set forth in box 510. In this particular embodiment, the exposure tool 310 has been initialized for processing by the APC system manager 440 through the machine interface 430 and the equipment interface 410. In this particular embodiment, before the exposure tool 300 is run, the APC system manager script is called to initialize the exposure tool 300. At this step, the script records the identification number of the exposure tool 300 and the lot number of the wafers 305. The identification number is then stored against the lot number in the data store 360. The rest of the script, such as the APCData call and the Setup and StartMachine calls, are formulated with blank or dummy data in order to force the machine to use its default settings.

As part of this initialization, the initial setpoints for critical dimension and overlay control are provided to the overlay controller 315 over the line 320. These initial setpoints may be determined and implemented in any suitable manner known to the art. In the particular embodiment illustrated, overlay controls are implemented by control threads. Each control thread acts like a separate controller and is differentiated by various process conditions. For overlay control, the control threads are separated by a combination of different conditions. These conditions may include, for example, the semiconductor exposure tool 300 currently processing the wafer lot, the semiconductor product, the semiconductor manufacturing operation, and the semiconductor exposure tool 300 that processes the semiconductor wafer lot at a previous layer of the wafer.

Control threads are separated because different process conditions affect the overlay error differently. By isolating each of the process conditions into its own corresponding control thread, the overlay error can become a more accurate portrayal of the conditions in which a subsequent semiconductor wafer lot in the control thread will be processed. Since the error measurement is more relevant, changes to the control input signals based upon the error will be more appropriate.

The control thread for the overlay control scheme depends upon the current exposure tool, current operation, the product code for the current lot, and the identification number at the previous patterned layer. The first three parameters are generally found in the context information that is passed to the script from the exposure tool 300. The fourth parameter is generally stored when the lot is processed through the previous layer. Once all four parameters are defined, they are combined to form the control thread name; STP02_OPER01_PROD01_STP01 is an example of a control thread name. The control thread name is also stored in correspondence to the wafer lot number in the data store 360.

Once the lot is associated with a control thread name, the initial settings for that control thread are generally retrieved from the data store 360. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the overlay errors as the control input settings. It is preferred that the controllers use the default machine settings as the initial settings. By assuming some settings, the overlay errors can be related back to the control settings in order to facilitate feedback control.

Another possibility is that the initial settings are stored under the control thread name. In this case, one or more wafer lots have been processed under the same control thread name as the current wafer lot, and have also been measured for overlay error using the review station 317. When this information exists, the control input signal settings are retrieved from the data store 360. These settings are then downloaded to the exposure tool 300.

The wafers 305 are processed through the exposure tool 300. This includes, in the embodiment illustrated, source/drain and poly gate fabrication. The wafers 305 are measured on the review station 317 after their exposure on the tool 300. The review station 317 examines the wafers 305 after they are processed for a number of errors. The data generated by the instruments of the review station 317 is passed to the machine interface 430 via sensor interface 415 and the line 320. The review station script begins with a number of APC commands for the collection of data. The review station script then locks itself in place and activates a data available script. This script facilitates the actual transfer of the data from the review station 317 to the APC framework. Once the transfer is completed, the script exits and unlocks the review station script. The interaction with the review station 317 is then generally complete.

As will be appreciated by those skilled in the art having the benefit of this disclosure, the data generated by the review station 317 should be pre-processed for use. Review stations, such as KLA review stations, provide the control algorithms for measuring the control error. Each of the error measurements, in this particular embodiment, corresponds to one of the control input signals on the line 320 in a direct manner. Before the error can be utilized to correct the control input signal, a certain amount of preprocessing is generally completed.

For example, pre-processing may include outlier rejection. Outlier rejection is a gross error check ensuring that the received data is reasonable in light of the historical performance of the process. This procedure involves comparing each of the overlay errors to its corresponding predetermined boundary parameter. In one embodiment even if one of the predetermined boundaries is exceeded, the error data from the entire semiconductor wafer lot is generally rejected.

To determine the limits of the outlier rejection, thousands of actual semiconductor manufacturing fabrication ("fab") data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

Pre-processing may also smooth the data, which is also known as filtering. Filtering is important because the error measurements are subject to a certain amount of randomness, such that the error significantly deviates in value. Filtering the review station data results in a more accurate assessment of the error in the control input signal settings. In one embodiment, the overlay control scheme utilizes a filtering procedure known as an Exponentially-Weighted Moving Average ("EWMA") filter, although other filtering procedures can be utilized in this context.

One embodiment for the EWMA filter is represented by Equation 1:

$$AVG_N = W*M_C + (1-W)*AVG_P \quad (1)$$

where
$AVG_N$≡the new EWMA average;
$W$≡a weight for the new average ($AVG_N$);
$M_C$≡the current measurement; and
$AVG_P$≡the previous EWMA average.

The weight is an adjustable parameter that can be used to control the amount of filtering and is generally between zero and one. The weight represents the confidence in the accuracy of the current data point. If the measurement is considered accurate, the weight should be close to one. If there were a significant amount of fluctuations in the process, then a number closer to zero would be appropriate.

In one embodiment, there are at least two techniques for utilizing the EWMA filtering process. The first technique uses the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second technique retains only some of the data and calculates the average from the raw data each time.

The manufacturing environment in the semiconductor manufacturing fab presents some unique challenges. The order that the semiconductor wafer lots are processed through an exposure tool may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the control input signal settings.

The overlay controller 315, in this particular embodiment, uses limited storage of data to calculate the EWMA filtered error, i.e., the first technique. Wafer lot data, including the lot number, the time the lot was processed, and the multiple error estimates, are stored in the data store 360 under the control thread name. When a new set of data is collected, the stack of data is retrieved from data store 360 and analyzed. The lot number of the current lot being processed is compared to those in the stack. If the lot number matches any of the data present there, the error measurements are replaced. Otherwise, the data point is added to the current stack in chronological order, according to the time periods when the lots were processed. In one embodiment, any data point within the stack that is over 48 hours old is removed. Once the aforementioned steps are complete, the new filter average is calculated and stored to data store 360.

Thus, the data is collected and pre-processed, and then processed to generate an estimate of the current errors in the control input signal settings. First, the data is passed to a compiled Matlab® plugin that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with, the lot is retrieved, and all of the relevant operation upon the stack of lot data is carried out. This includes replacing redundant data or removing older data. Once the data stack is adequately prepared, it is parsed into ascending time-ordered arrays that correspond to the error values. These arrays are fed into the EWMA plug-in along with an array of the parameter required for its execution. In one embodiment, the return from the plug-in is comprised of the six filtered error values.

Returning to FIG. 5, data pre-processing includes identifying a disturbance in an overlay operation arising from critical dimension control of the exposure tool 310 as set forth in the box 520. Known, potential disturbances may be identified by characteristic data patterns or may be identified as known consequences to modifications to critical dimension control. The example of how changes in temperature affect magnification given above falls into this latter category.

The next step in the control process is to calculate the new settings for the overlay controller 315 of the exposure tool 300. The previous settings for the control thread corresponding to the current wafer lot are retrieved from the data store 360. This data is paired along with the current set of overlay errors. The new settings are calculated by calling a compiled Matlab® plug-in. This application incorporates a number of inputs, performs calculations in a separate execution component, and returns a number of outputs to the main script. Generally, the inputs of the Matlab® plug-in are the control input signal settings, the review station errors, an array of parameters that are necessary for the control algorithm, and a currently unused flag error. The outputs of the Matlab® plug-in are the new controller settings, calculated in the plugin according to the controller algorithm described above.

A photolithography process engineer or a control engineer, who generally determines the actual form and extent of the control action, can set the parameters. They include the threshold values, maximum step sizes, controller weights, and target values. Once the new parameter settings are calculated, the script stores the setting in data store 360 such that the exposure tool 300 can retrieve them for the next wafer lot to be processed. The principles taught by the present invention can be implemented into other types of manufacturing frameworks.

Returning again to FIG. 5, the calculation of new settings includes, as set forth in the box 530, modeling the identified disturbance. This modeling may be performed by the Matlab® plugin. In this particular embodiment, only known, potential disturbances are modeled and the models are stored in the database 335 accessed by the machine interface 430. The database 335 may reside on the workstation 330, as shown, or some other part of the APC framework. For instance, the models might be stored in the data store 360 managed by the APC system manager 440 in alternative embodiments. The model will generally be a mathematical model, i.e., an equation describing how the change in critical dimension control affects the overlay performance.

The particular model used will be implementation specific, depending upon the particular exposure tool 300 and the particular disturbance being modeled. Referring once again to the example of temperature/magnification example, the relationship can be described by Equation (2):

$$\Delta_m = m(T_a - T_b) + b \qquad (2)$$

where
$\Delta_m$ ≡ the change in magnification;
m ≡ the magnification factor;
$T_a$ ≡ the ambient temperature;
$T_b$ ≡ the baseline temperature; and
b ≡ a tool dependent offset.

Whether the relationship is linear or non-linear will be dependent on the particular parameters involved.

The new settings are then transmitted to and applied by the overlay controller 315. Thus, returning now to FIG. 5, once the identified disturbance is modeled, the model is applied to modify a control input parameter, as set forth in the box 540. In this particular embodiment, the control input is an overlay control input. Using the same example, the machine interface 430 retrieves the model from the database 335, plugs in the values for the magnification (m), the ambient temperature ($T_a$), the baseline temperature ($T_b$), and the tool dependent offset (b), and determines the necessary change in the magnification parameter ($\Delta_m$). The change is then communicated by the machine interface 430 to the equipment interface 410 over the line.320. The equipment interface 410 then implements the change.

The present embodiment furthermore provides that the models be updated. This includes, as set forth in boxes 550–560 of FIG. 5, monitoring the effect of modifying the control input parameters and updating the applied model. For instance, various aspects of the exposure tool 300's operation will change as the tool 300 ages. Referring again to the temperature/magnification example, the tool dependent offset (b) might therefore vary as the tool ages. By monitoring the effect the changes implemented as a result of the disturbance, the necessary value could be updated to yield superior performance.

As noted above, this particular embodiment implements an APC system. Thus, changes are implemented "between" lots. The actions set forth in the boxes 520–560 are implemented after the current lot is processed and before the second lot is processed as set forth in box 570 of FIG. 5. However, the invention is not so limited. Furthermore, as noted above a lot may constitute any practicable number of wafers from one to several thousand. What constitutes a "lot" is implementation specific, and so the point of the fabrication process in which the updates occur will vary from implementation to implementation.

Hierarchical Ordering of Conditions. One particular variation of this implementation includes a hierarchical ordering of conditions that constitute a control thread. Hierarchical ordering is taught generally, without reference to the present invention, in application Ser. No. 09/371,665, filed Aug. 10, 1999, entitled "Method and Apparatus for Performing Run-to-Run Control in a Batch Manufacturing Environment," by Anthony J. Toprac, William J. Campbell, and Christopher A. Bode. This application is hereby incorporated by reference for all purposes as if fully set forth herein verbatim. In one embodiment, the hierarchical ordering of control thread data is related to the strength of the effects that these conditions exert on the control of a manufacturing process.

Generally, a number of discrete process factors will affect the performance of a given manufacturing process. These factors can be arranged in a hierarchy. The different levels in the hierarchy can be arranged in order of the relative impact each of the previous process factors will have on the variance of the present manufacturing process. Each wafer lot processed will generally involve a discrete value from each hierarchy, but will contribute process information to multiple hierarchical levels. Control of each wafer lot will use the lowest hierarchical level (the second level being lower than the first level) for which there is previous process metrology information. Generally, the processing of each wafer lot will add information to each hierarchical level.

More particularly, the control inputs of the exposure tool used in a process may be defined as the first level of a hierarchical ordering of control thread data. The control inputs of a previous operation may be the second most influential factor on the control inputs of the present process, which can be defined as the second level of the hierarchical ordering of control thread data. The control inputs relating to a similar product type may be the third most influential factor on the control inputs of the present process, which can be defined as the third level of the hierarchical ordering of control thread data. Further levels of the hierarchical ordering of control thread data can be defined using other similarities between previous processes and a current process.

Using the aforementioned hierarchical ordering of control thread data, an automatic spawning of control threads can be implemented. In one embodiment, initially, the control inputs for a plurality of semiconductor lots are placed into a single control thread. When sufficient data is present to prove a statistically significant difference between lots belonging to different hierarchical levels, a process controller splits the initial control thread into two control threads. As more data is obtained, new control threads that represent different hierarchical levels are generated. The modeled disturbance may be one factor defining or ordering the hierarchy as described above.

Generally speaking, one control thread is used to run a manufacturing process on a lot of semiconductor devices, much as is described above for FIGS. 3–5. Metrology process data is acquired and control input errors are calculated. The control inputs for the next process run are modified on a run-to-run-basis, based upon errors detected from a previous manufacturing run. Based upon the errors detected from the previous manufacturing run, new control input settings are determined and an appropriate bin in a hierarchical level is filled with data, effectively creating new control threads.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for processing a semiconductor wafer, comprising:

identifying a disturbance in a photolithographic process; and applying a model of the identified disturbance to the identified disturbance;

controlling an input parameter for the photolithographic process responsive to a result from the application of the model.

2. The method of claim 1, wherein identifying the disturbance in the photolithographic process includes identifying a disturbance arising from an ambient condition.

3. The method of claim 2, wherein identifying the disturbance includes identifying a magnification disturbance arising from a deviant temperature.

4. The method of claim 1, wherein identifying the disturbance in the photolithographic process includes identifying a disturbance in an overlay operation.

5. The method of claim 4, wherein identifying the disturbance includes identifying a magnification disturbance arising from a deviant temperature.

6. The method of claim 1, wherein applying the model of the identified disturbance includes extracting an appropriate model from a store of potential models.

7. The method of claim 1, wherein controlling the input parameter includes resetting a set point for the photolithographic process.

8. The method of claim 1, further comprising processing a wafer lot through the exposure tool in which the photolithographic process is performed.

9. The method of claim 8, wherein processing the wafer lot includes processing a plurality of wafers.

10. The method of claim 1, further comprising:

monitoring the effect of modifying the control parameter; and updating the model.

* * * * *